United States Patent
Wang et al.

(10) Patent No.: US 12,085,625 B2
(45) Date of Patent: Sep. 10, 2024

(54) MONITORING OF BATTERY MODULE BASED ON CELL VOLTAGE RANKINGS

(71) Applicant: GM GLOBAL TECHNOLOGY OPERATIONS LLC, Detroit, MI (US)

(72) Inventors: Fang Wang, Troy, MI (US); Yue-Yun Wang, Troy, MI (US); Anthony P. Tata, Linden, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 144 days.

(21) Appl. No.: 17/941,594

(22) Filed: Sep. 9, 2022

(65) Prior Publication Data

US 2024/0085490 A1    Mar. 14, 2024

(51) Int. Cl.
| | |
|---|---|
| *G01R 31/396* | (2019.01) |
| *B60L 3/00* | (2019.01) |
| *B60L 58/30* | (2019.01) |
| *G01R 31/36* | (2020.01) |
| *G01R 31/3835* | (2019.01) |
| *G01R 31/388* | (2019.01) |
| *G01R 31/392* | (2019.01) |

(52) U.S. Cl.
CPC .......... *G01R 31/396* (2019.01); *B60L 3/0046* (2013.01); *B60L 58/30* (2019.02); *G01R 31/3648* (2013.01); *G01R 31/3835* (2019.01); *G01R 31/388* (2019.01); *G01R 31/392* (2019.01)

(58) Field of Classification Search
None
See application file for complete search history.

(56) References Cited

U.S. PATENT DOCUMENTS

| | | | |
|---|---|---|---|
| 2020/0025832 A1* | 1/2020 | Cho | G01R 31/392 |
| 2022/0390520 A1* | 12/2022 | Park | H01M 10/482 |

* cited by examiner

*Primary Examiner* — Jas A Sanghera
(74) *Attorney, Agent, or Firm* — Quinn IP Law

(57) ABSTRACT

A system for monitoring a battery module having a plurality of cells includes a sensor adapted to obtain respective cell voltages of the plurality of cells. The controller is adapted to receive data from the sensor, the controller having a processor and tangible, non-transitory memory on which instructions are recorded. The controller is configured to sort the respective cell voltages to create a voltage ranking. The voltage ranking is repeated with at least one new set of cell voltage readings obtained at a predefined checking frequency. Differences in the voltage ranking of the plurality of cells are analyzed. The controller is adapted to control operation of the battery module based in part on differences in the voltage ranking. The controller may be adapted to predict likelihood of a thermal runway event based in part on the differences in the voltage ranking.

18 Claims, 4 Drawing Sheets

MONITORING OF BATTERY MODULE BASED ON CELL VOLTAGE RANKINGS

INTRODUCTION

The present disclosure relates to a system and method for monitoring a battery module having a plurality of cells based in part on rankings of cell voltages. The use of mobile platforms employing a rechargeable energy source, both as an exclusive source of energy and a non-exclusive source of energy, has greatly increased over the last few years. A rechargeable energy storage device with battery packs may store and release electrochemical energy as needed during a given operating mode. The electrochemical energy may be employed for propulsion, heating or cooling a cabin compartment, powering vehicle accessories and other uses. The various cells in the battery packs may be characterized by different power, state of charge and capacity rates.

SUMMARY

Disclosed herein is a system for monitoring a battery module having a plurality of cells. The system includes a sensor adapted to obtain respective cell voltages of the plurality of cells. A controller adapted to receive data from the sensor, the controller having a processor and tangible, non-transitory memory on which instructions are recorded. The controller is configured to sort the respective cell voltages to create a voltage ranking. The voltage ranking is repeated with at least one new set of cell voltage readings at a predefined checking frequency. Differences in the voltage ranking of the plurality of cells are analyzed. The controller is adapted to control operation of the battery module based in part on differences in the voltage ranking. The controller may be adapted to predict likelihood of a thermal runway event based in part on the differences in the voltage ranking.

The controller is adapted to predict likelihood of a thermal runway event based in part on the differences in the voltage ranking. In some embodiments, the battery module is located within an electric vehicle, the predefined checking frequency being varied based on an operational power mode of the electric vehicle. The predefined checking frequency includes a first checking frequency when the electric vehicle is in a driving mode and a second checking frequency when the electric vehicle is in a park mode.

In one example, the first checking frequency is once every 2 hours and the second checking frequency is once every 6 to 8 hours. The controller may be adapted to determine if there is a change in the voltage ranking for a test cell. If there is no change in the voltage ranking, the controller may be adapted to determine whether the respective cell voltages of a highest-ranked cell and a lowest-ranked cell in the plurality of cells are within a respective acceptable range. The controller may be adapted to set up a diagnostic test for the test cell when the respective cell voltages of the highest-ranked cell and the lowest-ranked cell in the plurality of cells are outside the respective acceptable range.

In some embodiments, the controller is adapted to set a flag on the test cell and check for a repeating pattern when the change in the voltage ranking of the test cell is less than a predefined threshold. When the change in the voltage ranking of the test cell is at or above the predefined threshold, the controller may be adapted to determine whether the voltage ranking of at least one adjacent cell has increased beyond a predetermined amount. When the voltage ranking of the at least one adjacent cell has not changed beyond the predetermined amount, the controller is adapted to increase the predefined checking frequency.

When the voltage ranking of the at least one adjacent cell has changed beyond the predetermined amount, the controller is adapted to determine whether an average voltage of the test cell and the at least one adjacent cell is within an acceptable range. If the average voltage is within the acceptable range, the controller is programmed to check for a leakage on a sense line between the plurality of cells and the sensor. If the average voltage is outside the acceptable range, the controller is programmed to increase the predefined checking frequency.

Disclosed herein is a method for monitoring a battery module having a plurality of cells in a system having a controller with a processor and tangible, non-transitory memory. The method includes obtaining respective cell voltages of the plurality of cells, via a sensor, and sorting the respective cell voltages to create a voltage ranking, via the controller. The method includes repeating the voltage ranking with at least one new set of cell voltage readings obtained at a predefined checking frequency and analyzing differences in the voltage ranking of the plurality of cells. Operation of the battery module is controlled based in part on differences in the voltage ranking.

Disclosed herein is an electric vehicle including a battery module having a plurality of cells. A sensor is adapted to obtain respective cell voltages of the plurality of cells. A controller is adapted to receive data from the sensor. The controller has a processor and tangible, non-transitory memory on which instructions are recorded. The controller is configured to sort the respective cell voltages to create a voltage ranking. The voltage ranking is repeated with at least one new set of cell voltage readings obtained at a predefined checking frequency.

The controller is configured to determine whether a change in the voltage ranking occurs for a test cell. When the change in the voltage ranking of the test cell is less than a predefined threshold, the controller is configured to search for a repeating pattern for the test cell. When the change in the voltage ranking of the test cell is at or above the predefined threshold, the controller is configured to determine whether the voltage ranking of at least one adjacent cell has increased or decreased beyond a predetermined amount.

The above features and advantages and other features and advantages of the present disclosure are readily apparent from the following detailed description of the best modes for carrying out the disclosure when taken in connection with the accompanying drawings.

Figure 1:
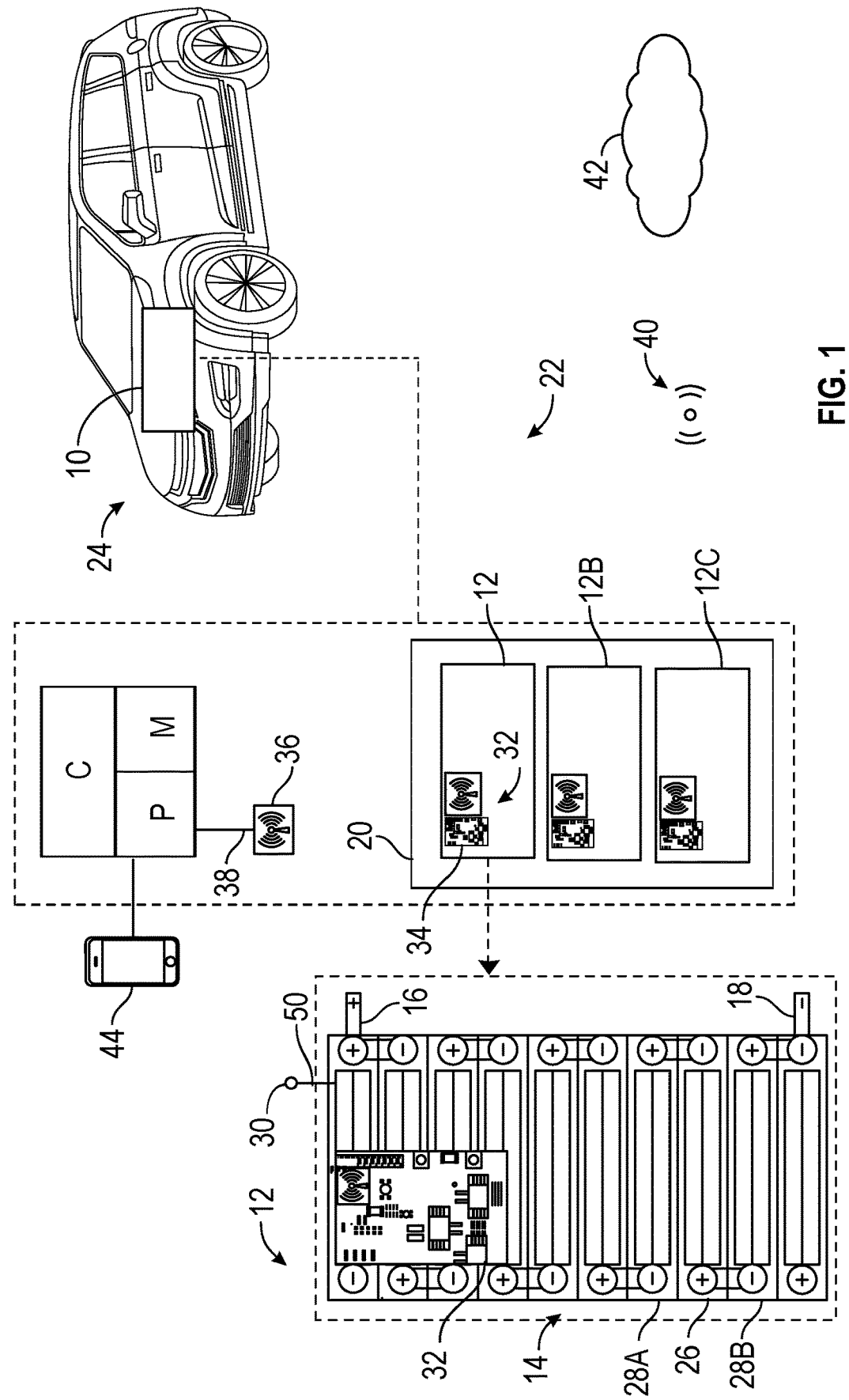
FIG. 1 is a schematic diagram of a system for monitoring a plurality of cells in a battery module, the system having a controller.

Representative embodiments of this disclosure are shown by way of non-limiting example in the drawings and are described in additional detail below. It should be understood, however, that the novel aspects of this disclosure are not limited to the particular forms illustrated in the above-enumerated drawings. Rather, the disclosure is to cover modifications, equivalents, combinations, sub-combinations, permutations, groupings, and alternatives falling within the scope of this disclosure as encompassed, for instance, by the appended claims.

DETAILED DESCRIPTION

Referring to the drawings, wherein like reference numbers refer to like components, FIG. 1 schematically illustrates a system 10 for monitoring a battery module 12 having a plurality of cells 14 connected in series. The plurality of cells 14 are connected for current flow between a first terminal 16 and a second terminal 18. The plurality of cells 14 may include battery cells having different chemistries, including but not limited to, lithium-ion, lithium-iron, nickel metal hydride and lead acid batteries.

The battery module 12 may be part of a battery pack 20 in a rechargeable energy storage device 22. The battery pack 20 may include additional modules, such as module 12B and module 12C. It is understood that the number of cells in each module and the number of modules per battery pack may be varied based on the application at hand.

The rechargeable energy storage device 22 may be used to power an electric vehicle 24, which may be partially electric or fully electric. The electric vehicle 24 may be a mobile platform, such as, but not limited to, a passenger vehicle, sport utility vehicle, light truck, heavy duty vehicle, ATV, minivan, bus, transit vehicle, bicycle, moving robot, farm implement (e.g., tractor), sports-related equipment (e.g., golf cart), boat, plane and train. It is to be understood that the electric vehicle 24 may take many different forms and have additional components.

Referring to FIG. 1, the system 10 includes a controller C with at least one processor P and at least one memory M (or non-transitory, tangible computer readable storage medium) on which instructions are recorded for executing a method 100 for monitoring the battery module 12, described below with respect to FIG. 2. The memory M can store executable instruction sets, and the processor P can execute the instruction sets stored in the memory M.

The controller C is adapted to rank the respective cell voltages of the plurality of cells 14 to create a baseline or benchmark alignment among the cells. The ranking positions are compared periodically to identify problematic cells, with the time duration or frequency between checks being configurable based on battery operating conditions. The method 100 is not tied to a particular cell type, chemistry and configuration of the battery pack 20.

Battery thermal runaway in a battery module 12 is generally detected after it happens. The system 10 predicts cell failure prior to the thermal runaway condition, using the voltage ranking and changes in the ranking position for each of the plurality of cells 14. This provides the advantage of additional time for mitigation and controls. Thermal runaway propagation occurs when a single cell enters thermal runaway, releases a large quantity of heat, and heats neighboring cells to the point of thermal runaway. The method 100 reduces the thermal propagation risk by analyzing changes in rank for neighboring cells of a test cell 26, such as adjacent cells 28A and 28B.

Referring to FIG. 1, the system 10 includes at least one sensor 30 adapted to obtain respective cell voltages of the plurality of cells 14. It is understood that the sensor 30 may include detection components available to those skilled in the art. The battery module 12 may include a module management unit 32 embedded with a microcircuit 34. The microcircuit 34 may be an assembly of electronic components, with a core embodied by a microcontroller and including a wireless communication interface available to those skilled in the art. The microcircuit 34 may include an associated memory, an associated processor and an integrated electronic controls unit, such as an application-specific integrated circuit (ASIC).

The module management unit 32 is configured to store and/or measure parameters pertaining to the battery module 12 as a whole or individual ones of the plurality of cells 14 in the module. These parameters may include respective voltages for the plurality of cells 14, module current, module temperature, module state of charge, module capacity and cell state of charge. Thus, in the event one of the modules in the battery pack requires servicing, a diagnostic scan tool or module repair tool may work directly with the module management unit 32 for service and refurbishing.

Referring to FIG. 1, a pack communicator 36 may be linked or connected to the controller C via a communication BUS 38, which may be a serial communication BUS in the form of a local area network. The local area network may include, but is not limited to, a Controller Area Network (CAN), a Controller Area Network with Flexible Data Rate (CAN-FD). The pack communicator 36 may be adapted to interface wirelessly with the module management unit 32, via a wireless network 40, which may be a short-range network or a long-range network.

Figure 2:
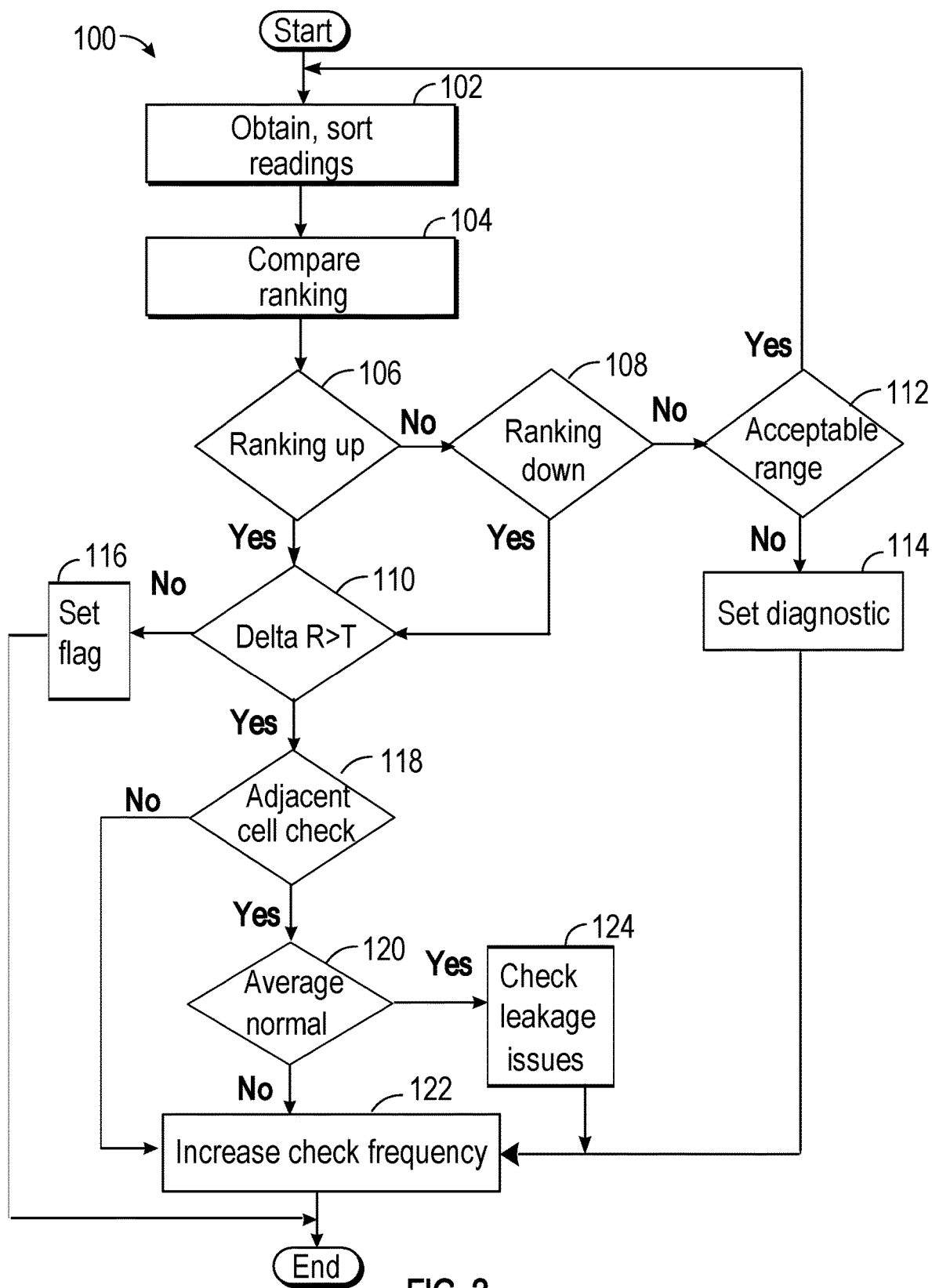
FIG. 2 is a schematic flow diagram of a method executable by the controller of FIG. 1.

Referring now to FIG. 2, a flowchart of the method 100 stored on and executable by the controller C of FIG. 1 is shown. Method 100 may be embodied as computer-readable code or instructions stored on and partially executable by the controller C of FIG. 1. Method 100 need not be applied in the specific order recited herein. Furthermore, it is to be understood that some steps may be eliminated. The method 100 may be dynamically executed. As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine.

Per block 102 of FIG. 2, the method 100 includes obtaining individual cell voltage readings. The cell voltage readings may be filtered for noise and other factors. The controller C is adapted to sort the cell voltage readings and assign a corresponding position number or cell ranking to each of the plurality of cells 14. The rank order is then stored by the controller C. The cell with the highest voltage may be ranked number one (highest-ranked cell) and the cell with the lowest voltage may be ranked last (lowest-ranked cell). Alternatively, the ranking order may be reversed, and the highest voltage may be ranked last. The voltages of cell groups connected in series generally move in a similar pattern due to similar operating conditions. Ranking the voltages creates a benchmark alignment between the plurality of cells 14.

Proceeding to block 104, the controller C is adapted to compare the rank order to prior rank orders. The controller C may use different time threshold for different power modes. Advancing to block 106, the controller C is programmed to determine if the cell ranking for a specific cell, referred to herein as test cell 26, has increased. This is completed for each of the plurality of cells 14, with each of the plurality of cells 14 being the test cell 26.

Per block 106, if the cell ranking of the test cell 26 has not increased (block 106=NO) compared to the previous iteration, the method 100 proceeds to block 108 to determine whether the cell ranking has decreased. If the cell ranking has changed, either increased (block 106=YES) or decreased (block 108=YES), the method 100 advances to block 110 to determine whether the change in ranking (delta R) is greater than a predefined threshold (7). In other words, the controller C checks if the ranking change (either up or down) above a certain threshold. For example, the threshold may be a shift of at least 20% in the rankings.

Per block 108, if the cell ranking has not decreased (block 108=NO), the method 100 advances to block 112, where the controller C is programmed to check if the voltage of the highest-ranked and lowest-ranked cells in the plurality of cells 14 are within a respective acceptable range.

Per block 112, if the voltage of the highest-ranked and lowest-ranked cells are within the respective acceptable ranges (block 112=YES), the method 100 loops back to block 102. If not (block 112=NO), the method 100 advances to block 114, where the controller C is programmed to set up a diagnostic test on the test cell 26. From block 114, the method 100 advances to block 122, described below.

Per block 110, if the ranking change is below the predefined threshold (block 110=NO), the method 100 advances to block 116, where the controller C is programmed to set a flag on the test cell 26 and check if the same pattern is continuous or repeating. The method 100 is then ended. Per block 110, if the ranking change is at or above the predefined threshold (block 110=YES), the method 100 advances to block 118, where the controller C is programmed to check whether the ranking of a neighboring cell (such as adjacent cells 28A, 28B) has been affected (e.g., increased or decreased beyond a threshold amount).

Per block 118, if ranking of the adjacent cells 28A, 28B is unaffected (block 118=NO), the method 100 advances to block 122, where the controller C is programmed to increase the checking frequency (of cell voltage ranking). The method 100 is then ended. Per block 122, the controller C may determine if mitigating actions are required. Per block 118, if ranking of the adjacent cells 28A, 28B has been affected (block 118=YES), the method 100 advances to block 120 to determine whether the average of the voltages of the test cell 26 and the adjacent cells 28A, 28B is within an acceptable range.

Per block 120, if the average of the cell voltages is within an acceptable range (block 120=YES), the method 100 proceeds to block 124 to verify if the symptom is caused by a leakage on a sensing line or connection between the plurality of cells 14 and the sensor 30, schematically shown as sense line 50 in FIG. 1. Thus, if the ranking of the adjacent cells 28A, 28B has changed but the average of the voltages of the test cell 26 and the adjacent cells 28A, 28B is within an acceptable range, this may be indicative of a leakage on the sensing line. From block 124, the method 100 proceeds to block 122. Per block 120, if the average of the cell voltages is outside the acceptable range (block 120=NO), the method 100 proceeds to block 122 where the controller C is programmed to increase the checking frequency (of cell voltage ranking) and determine if mitigating actions are required. The method 100 is then ended.

The controller C may control operation of the battery pack 20 based in part on the cell voltage rankings, including adjusting battery charging current and time-based parameters such as pack voltage, temperature and current limits. If the battery module 12 is in an electric vehicle 24, the check frequency may be varied based on the operational power mode of the electric vehicle 24. Hence, the method 100 may be repeated at a first checking frequency when the electric vehicle 24 is in a driving mode and at a second checking frequency when the electric vehicle 24 is in a park mode or OFF mode. In one example, the first checking frequency is about once every 1-2 hours and the second checking frequency is about once every 4-8 hours.

Figure 3:
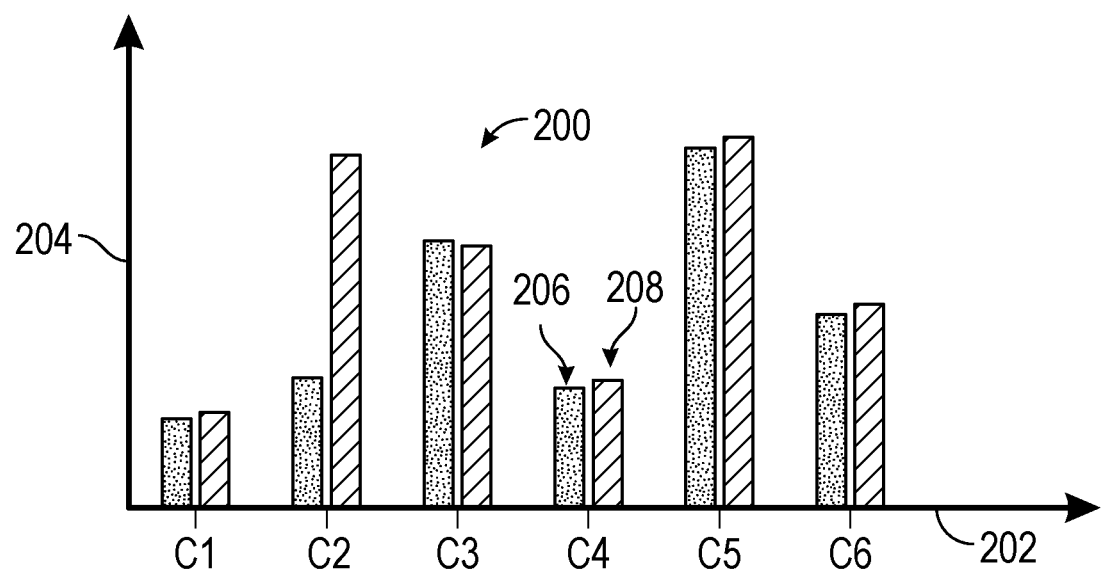
FIG. 3 is a schematic bar graph of example consecutive cell voltage rankings for a group of cells.

Referring now to FIG. 3, a bar graph of example consecutive cell voltage rankings 200 for a group of cells is shown. The vertical axis 204 indicates cell voltage ranking and the horizontal axis 202 indicates the respective cells C1, C2, C3, C4, C5 and C6. The first rank 206 for the respective cells is determined at an initial time and the second rank 208 at a later time. A problematic cell may be identified through a dramatic change in ranking position or rank. The first and second ranks 206, 208 are relatively similar for the respective cells C1, C3, C4, C5 and C6. However, the first and second ranks 206, 208 are markedly different for the cell C2, indicating a problem or issue.

Figure 4:
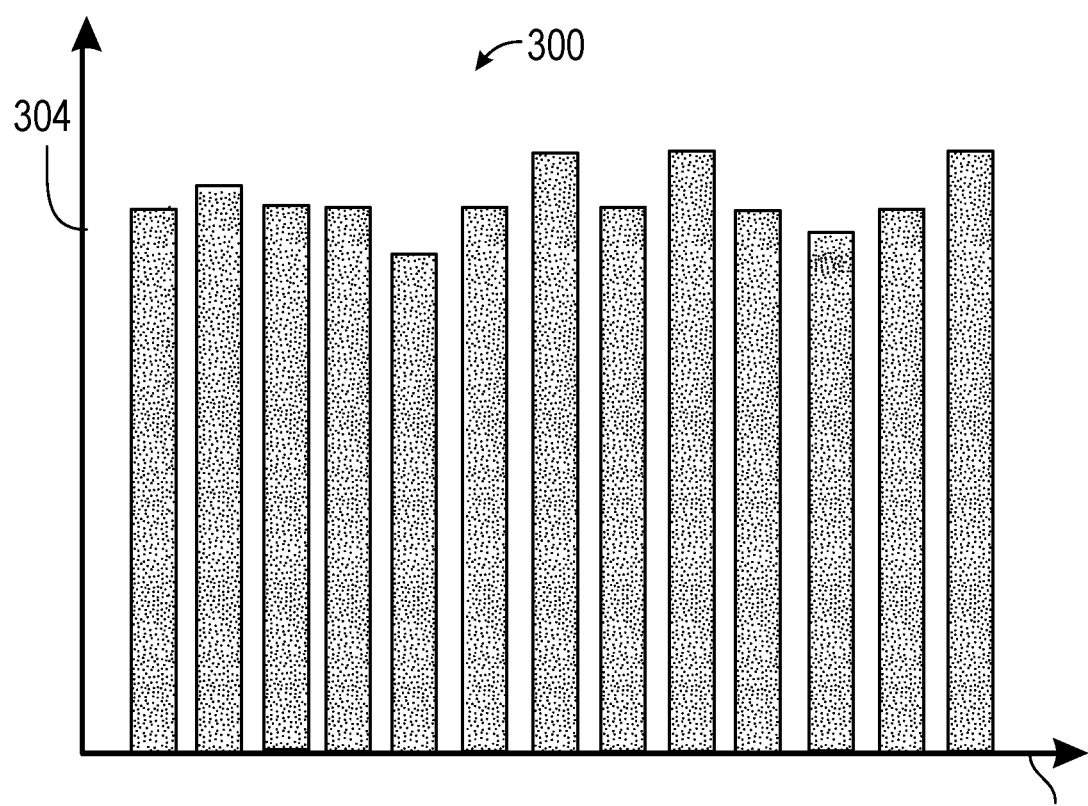
FIG. 4 is a schematic graph of cell voltage rankings over time for a healthy cell.

Referring now to FIG. 4, a schematic graph of voltage rankings 300 over a specific time period (e.g., 3 hours) for a healthy cell is shown. The vertical axis 304 indicates voltage ranking (or position) and the horizontal axis 302 indicates time. For example, each bar may indicate a voltage ranking obtained after 10 minutes of the previous voltage ranking. As shown in FIG. 4, the voltage rankings 300 are relatively stable for the healthy cell over the time period shown.

Figure 5:
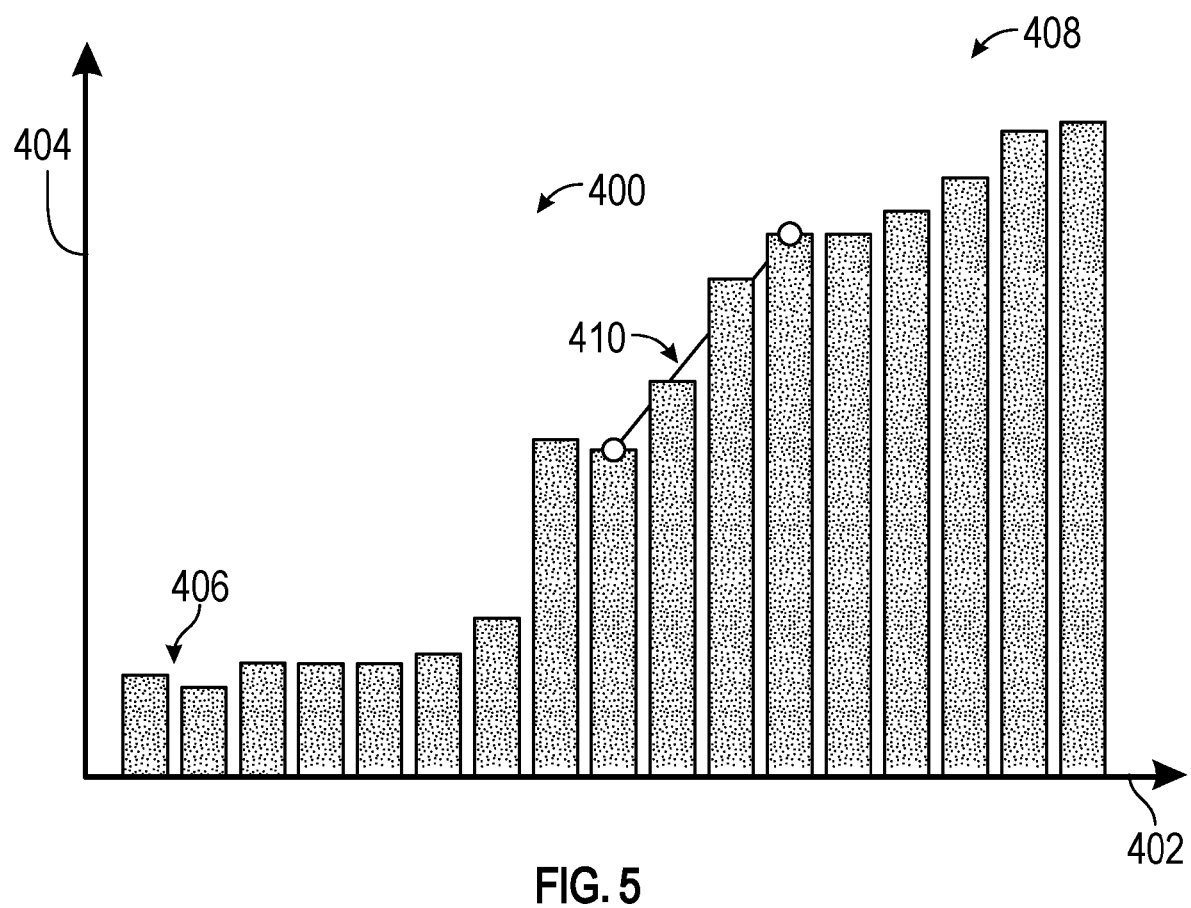
FIG. 5 is a schematic graph of cell voltage rankings over time for an unhealthy cell.

FIG. 5 is a schematic graph of cell voltage rankings 400 over a specific time period (e.g., 3 hours) for an unhealthy cell. The vertical axis 404 indicates voltage ranking (or position) and the horizontal axis 402 indicates time. For example, each bar may indicate a voltage ranking obtained after 10 minutes of the previous voltage ranking. For this unhealthy cell, the voltage ranking is relatively low at the beginning 406 of the time period and rises significantly towards the end 408 of the time period. It is understood that the voltage ranking may significantly increase or decrease (e.g., if the ranking order is reversed or the failure mode involves a lower cell voltage). The ratio of change in the cell voltage may be obtained by taking a slope 410 between two rankings. The ratio of voltage change between two measurements drives the cell voltage ranking position change in the battery module 12.

Referring to FIG. 1, the controller C may be configured to communicate a cloud unit 42, via the wireless network 40. The cloud unit 42 may include one or more servers hosted on the Internet to store, manage, and process data. The controller C may be configured to receive and transmit wireless communication to the cloud unit 42 through a mobile application 44, shown in FIG. 1. The mobile application 44 may be in communication with the controller C such that it has access to the data in the controller C. The circuitry and components of a mobile application 44 ("apps") available to those skilled in the art may be employed.

The wireless network 40 of FIG. 1 may be a Wireless Local Area Network (LAN) which links multiple devices using a wireless distribution method, a Wireless Metropolitan Area Networks (MAN) which connects several wireless LANs or a Wireless Wide Area Network (WAN) which covers large areas such as neighboring towns and cities. The wireless network 40 may be WIFI or a Bluetooth connection, defined as being a short-range radio technology (or wireless technology) aimed at simplifying communications among Internet devices and between devices and the Internet. Bluetooth is an open wireless technology standard for transmitting fixed and mobile electronic device data over short distances and creates personal networks operating within the 2.4 GHz band. Other types of connections may be employed.

In summary, the system 10 (via execution of method 100) provides the ability to use cell voltage ranking and differences in the cell voltage ranking to detect cell failure and trigger mitigation control as early as possible. The system 10 enables thermal runaway detection before it starts. The temperature increase at a problematic cell before a thermal runaway event may heat up adjacent cells and cause the adjacent cell rankings to go up. The system 10 tracks the ranking position of a cell 14 and its neighboring cells to predict the thermal runway event before it happens. Detection algorithms for battery thermal runaway generally require extensive controller on-time, effort and memory size requirements. In contrast, the system 10 does not require excessive data logging or computation and may be implemented quickly on existing hardware.

The controller C of FIG. 1 may be an integral portion of, or a separate module operatively connected to, other controllers of the electric vehicle 24. The controller C of FIG. 1 includes a computer-readable medium (also referred to as a processor-readable medium), including a non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random-access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, other magnetic medium, a CD-ROM, DVD, other optical medium, a physical medium with patterns of holes, a RAM, a PROM, an EPROM, a FLASH-EEPROM, other memory chip or cartridge, or other medium from which a computer can read.

Look-up tables, databases, data repositories or other data stores described herein may include various kinds of mechanisms for storing, accessing, and retrieving various kinds of data, including a hierarchical database, a set of files in a file system, an application database in a proprietary format, a relational database energy system (RDBMS), etc. Each such data store may be included within a computing device employing a computer operating system such as one of those mentioned above and may be accessed via a network in one or more of a variety of manners. A file system may be accessible from a computer operating system and may include files stored in various formats. An RDBMS may employ the Structured Query Language (SQL) in addition to a language for creating, storing, editing, and executing stored procedures, such as the PL/SQL language mentioned above.

The flowchart shown in the FIG. 2. illustrates an architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by specific purpose hardware-based systems that perform the specified functions or acts, or combinations of specific purpose hardware and computer instructions. These computer program instructions may also be stored in a computer-readable medium that can direct a controller or other programmable data processing apparatus to function in a particular manner, such that the instructions stored in the computer-readable medium produce an article of manufacture including instructions to implement the function/act specified in the flowchart and/or block diagram blocks.

The numerical values of parameters (e.g., of quantities or conditions) in this specification, including the appended claims, are to be understood as being modified in each respective instance by the term "about" whether or not "about" actually appears before the numerical value. "About" indicates that the stated numerical value allows some slight imprecision (with some approach to exactness in the value; about or reasonably close to the value; nearly). If the imprecision provided by "about" is not otherwise understood in the art with this ordinary meaning, then "about" as used herein indicates at least variations that may arise from ordinary methods of measuring and using such parameters. In addition, disclosure of ranges includes disclosure of each value and further divided ranges within the entire range. Each value within a range and the endpoints of a range are hereby disclosed as separate embodiments.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings, or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

What is claimed is:

1. A system for monitoring a battery module having a plurality of cells, the system comprising:
   a sensor adapted to obtain respective cell voltages of the plurality of cells;
   a controller adapted to receive data from the sensor, the controller having a processor and tangible, non-transitory memory on which instructions are recorded, the controller being configured to:
      sort the respective cell voltages to create a voltage ranking;
      repeat the voltage ranking with at least one new set of cell voltage readings obtained at a predefined checking frequency;
      analyze differences in the voltage ranking of the plurality of cells; and
      control operation of the battery module based in part on the differences in the voltage ranking;
   wherein the battery module is located within an electric vehicle, the predefined checking frequency being varied based on an operational power mode of the electric vehicle; and wherein the predefined checking frequency includes a first checking frequency when the electric vehicle is in a driving mode and a second checking frequency when the electric vehicle is in a park mode.

2. The system of claim 1, wherein the controller is adapted to predict likelihood of a thermal runway event based in part on the differences in the voltage ranking.

3. The system of claim 1, wherein the first checking frequency is once every 2 hours.

4. The system of claim 1, wherein the second checking frequency is once every 6 to 8 hours.

5. The system of claim 1, wherein the controller is adapted to:
determine if there is a change in the voltage ranking for a test cell; and
if there is no change in the voltage ranking, determine whether the respective cell voltages of a highest-ranked cell and a lowest-ranked cell in the plurality of cells are within a respective acceptable range.

6. The system of claim 5, wherein the controller is adapted to set up a diagnostic test for the test cell when the respective cell voltages of the highest-ranked cell and the lowest-ranked cell in the plurality of cells are outside the respective acceptable range.

7. The system of claim 1, wherein the controller is adapted to:
determine if there is a change in the voltage ranking for a test cell; and
set a flag on the test cell and check for a repeating pattern when the change in the voltage ranking of the test cell is less than a predefined threshold.

8. The system of claim 7, wherein the controller is adapted to determine whether the voltage ranking of at least one adjacent cell has increased beyond a predetermined amount, when the change in the voltage ranking of the test cell is at or above the predefined threshold.

9. The system of claim 8, wherein the controller is adapted to increase the predefined checking frequency when the voltage ranking of the at least one adjacent cell has not changed beyond the predetermined amount.

10. The system of claim 8, wherein the controller is adapted to determine whether an average voltage of the test cell and the at least one adjacent cell is within an acceptable range, when the voltage ranking of the at least one adjacent cell has changed beyond the predetermined amount.

11. The system of claim 10, wherein if the average voltage is within the acceptable range, the controller is programmed to check for a leakage on a sense line between the plurality of cells and the sensor.

12. The system of claim 10, wherein if the average voltage is outside the acceptable range, the controller is programmed to increase the predefined checking frequency.

13. A method for monitoring a battery module having a plurality of cells in a system having a controller with a processor and tangible, non-transitory memory, the method comprising:
obtaining respective cell voltages of the plurality of cells, via a sensor;
sorting the respective cell voltages to create a voltage ranking, via the controller;
repeating the voltage ranking with at least one new set of cell voltage readings obtained at a predefined checking frequency;
analyzing differences in the voltage ranking of the plurality of cells, including determining if there is a change in the voltage ranking for a test cell;
if there is no change in the voltage ranking, determining whether the respective cell voltages of a highest-ranked cell and a lowest-ranked cell in the plurality of cells are within a respective acceptable range;
setting up a diagnostic test for the test cell when the respective cell voltages of the highest-ranked cell and the lowest-ranked cell in the plurality of cells are outside the respective acceptable range; and
controlling operation of the battery module based in part on differences in the voltage ranking.

14. The method of claim 13, further comprising:
predicting likelihood of a thermal runway event based in part on the differences in the voltage ranking, the battery module being located within an electric vehicle; and
varying the predefined checking frequency based on an operational power mode of the electric vehicle.

15. The method of claim 13, further comprising:
checking for a repeating pattern when the change in the voltage ranking of the test cell is less than a predefined threshold; and
determining whether the voltage ranking of at least one adjacent cell has increased beyond a predetermined amount, when the change in the voltage ranking of the test cell is at or above the predefined threshold.

16. The method of claim 15, further comprising:
increasing the predefined checking frequency when the voltage ranking of the at least one adjacent cell has not changed beyond the predetermined amount; and
determining whether an average voltage of the test cell and the at least one adjacent cell is within an acceptable range, when the voltage ranking of the at least one adjacent cell has changed beyond the predetermined amount.

17. The method of claim 16, further comprising:
determining whether there is a leakage on a sense line between the plurality of cells and the sensor when the average voltage is within the acceptable range; and
increasing the predefined checking frequency when the average voltage is outside the acceptable range.

18. An electric vehicle comprising:
a battery module having a plurality of cells;
a sensor adapted to obtain respective cell voltages of the plurality of cells;
a controller adapted to receive data from the sensor, the controller having a processor and tangible, non-transitory memory on which instructions are recorded, the controller being configured to:
sort the respective cell voltages to create a voltage ranking;
repeat the voltage ranking with at least one new set of cell voltage readings obtained at a predefined checking frequency;
determine whether a change in the voltage ranking occurs for a test cell;
when the change in the voltage ranking of the test cell is less than a predefined threshold, search for a repeating pattern for the test cell; and
when the change in the voltage ranking of the test cell is at or above the predefined threshold, determine whether the voltage ranking of at least one adjacent cell has increased or decreased beyond a predetermined amount.

* * * * *